(12) United States Patent
Hwang et al.

(10) Patent No.: US 11,482,396 B2
(45) Date of Patent: Oct. 25, 2022

(54) ION SOURCE HEAD AND ION IMPLANTATION APPARATUS INCLUDING THE SAME

(71) Applicants: SK hynix Inc., Gyeonggi-do (KR); Pusan National University Industry-University Cooperation Foundation, Busan (KR)

(72) Inventors: Jong Jin Hwang, Gyeonggi-do (KR); Ho Jun Lee, Busan (KR)

(73) Assignees: SK hynix Inc., Gyeonggi-do (KR); Pusan National University Industry-University Cooperation Foundation, Busan (KR)

(*) Notice: Subject to any disclaimer, the term of this patent is extended or adjusted under 35 U.S.C. 154(b) by 57 days.

(21) Appl. No.: 17/210,815

(22) Filed: Mar. 24, 2021

(65) Prior Publication Data
US 2022/0013322 A1  Jan. 13, 2022

(30) Foreign Application Priority Data
Jul. 8, 2020  (KR) .................. 10-2020-0084193

(51) Int. Cl.
*H01J 37/08* (2006.01)
*C23C 14/48* (2006.01)
*H01J 37/317* (2006.01)

(52) U.S. Cl.
CPC ............. *H01J 37/08* (2013.01); *C23C 14/48* (2013.01); *H01J 37/3171* (2013.01)

(58) Field of Classification Search
CPC ........ H10J 37/08; H10J 37/3171; C23C 14/48
See application file for complete search history.

(56) References Cited

U.S. PATENT DOCUMENTS 9,520,274 B2   12/2016   Torregrosa et al.

FOREIGN PATENT DOCUMENTS

KR   10-2015-0140311   12/2015

*Primary Examiner* — Nicole M Ippolito
*Assistant Examiner* — Hanway Chang
(74) *Attorney, Agent, or Firm* — IP & T Group LLP

(57) ABSTRACT

An ion source head may include a reaction chamber and a coil. The reaction chamber may be configured to provide an ionization space. The reaction chamber may be divided into a lower region, a central region and an upper region. The coil may be configured to be wound on an outer surface of the reaction chamber. The coil may include a first coil, a second coil and a third coil. The first coil may be spirally wound on an outer surface of the lower region of the reaction chamber. The second coil may be wound on the central region of the reaction chamber. The third coil may be spirally wound on an outer surface of the upper region of the reaction chamber. The second coil may be connected between the first coil and the third coil. The second coil may have a winding direction obliquely to a winding direction of the first and third coils.

15 Claims, 3 Drawing Sheets

ION SOURCE HEAD AND ION IMPLANTATION APPARATUS INCLUDING THE SAME

CROSS-REFERENCES TO RELATED APPLICATION

The present application claims priority under 35 U.S.C. § 119(a) to Korean application number 10-2020-0084193, filed on Jul. 8, 2020, which is incorporated herein by reference in its entirety.

BACKGROUND

1. Technical Field

Various embodiments of the present invention may generally relate to a semiconductor fabrication apparatus and, more particularly, to an ion source head configured to generate inductively coupled plasma used in a high vacuum and a low flux. Various embodiments of the present invention may also relate to an ion implantation apparatus including the ion source head.

2. Related Art

Electric conductivity of various important characteristics of a semiconductor material may be controlled by adding an impurity to the semiconductor material. A method of adding the impurity to the semiconductor material may include thermal diffusion and ion implantation.

Ion implantation may include ionizing the impurity to be doped, accelerating the ionized impurity to form impurity ions having high kinetic energy, and implanting the ions into a wafer. Horizontal particle movements in the ion implantation may be substantially avoided compared to such movements which are significant when using thermal diffusion. Thus, unit cell integration may be substantially improved by using ion implantation.

Therefore, an improved ion implantation apparatus capable of implanting a desired amount of ions into a desired spot of a target surface and increasing ion density without damaging the targeted surface will be highly desirable.

SUMMARY

In various embodiments of the present disclosure, an ion source head may include a reaction chamber and a coil. The reaction chamber may be configured to provide an ionization space. The reaction chamber may be divided into a lower region, a central region and an upper region. The coil may be configured to be wound on an outer surface of the reaction chamber. The coil may include a first coil, a second coil and a third coil. The first coil may be spirally wound on an outer surface of the lower region of the reaction chamber. The second coil may be wound on the central region of the reaction chamber. The third coil may be spirally wound on an outer surface of the upper region of the reaction chamber. The second coil may be connected between the first coil and the third coil. The second coil may have a winding direction obliquely to a winding direction of the first and third coils.

In various embodiments of the present disclosure, an ion implantation apparatus may include an ion source head, a beam transmitter and an implantation-processing chamber. The ion source head may include a coil configured to generate an electromagnetic force along a height direction of a reaction chamber and an oblique direction with respect to the height direction. The beam transmitter may be configured to transmit plasma provided from the ion source head. The implantation-processing chamber may be configured to implant the plasma induced through the beam transmitter into an object.

According to various embodiments, the coil may be wounded on the outer surface of the reaction chamber along the oblique direction with respect to a diameter or the height of the reaction chamber. Thus, the electromagnetic force may be generated in the reaction chamber along the direction substantially perpendicular to the oblique coil to decrease an ion acceleration length and improve plasma generation efficiency in a low amount. As a result, ion byproducts may also be decreased by decreasing the ion acceleration length.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of embodiments of the present invention. However, the embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Embodiments may relate to a semiconductor fabrication apparatus, particularly, to an ion source head of an ion implantation apparatus configured to generate inductively coupled plasma.

Figure 1:
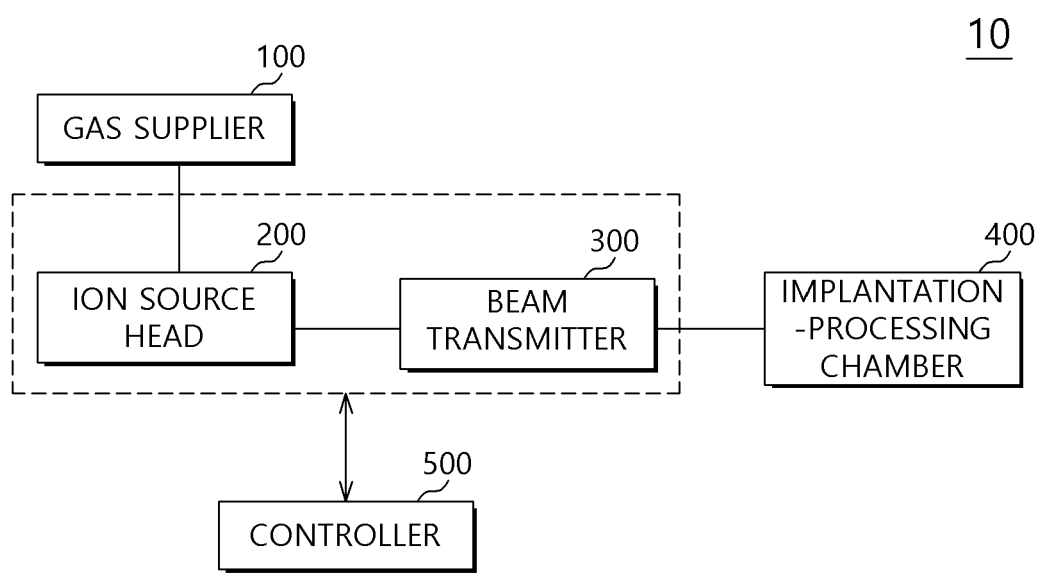
FIG. 1 is a view illustrating an ion implantation apparatus in accordance with an embodiment of the present disclosure.

FIG. 1 is a view illustrating an ion implantation apparatus in accordance with an embodiment of the present disclosure.

Referring to FIG. 1, an ion implantation apparatus 10 of an embodiment may include a gas supplier 100, an ion source head 200, a beam transmitter 300, an implantation-processing chamber 400 and a controller 500.

The gas supplier 100 may be configured to supply a source gas to the ion source head 200.

The ion source head 200 may receive the source gas from the gas supplier 100. The ion source head 200 may ionize the source gas to generate plasma. The ion source head 200 may ionize the source gas using an induced magnetic field formed by an RF (Radio Frequency) power. This plasma may be referred to as an inductively coupled plasma (ICP). Configurations and operations of the ion source head 200 may be illustrated later with reference to FIG. 2.

The beam transmitter 300 may select ions which are to be implanted (also referred to as the implanted ions) among the ions in the plasma generated from the ion source head 200. The beam transmitter 300 is capable of accelerating and transmitting the selected ions.

The implantation-processing chamber 400 may be configured to receive an object, for example, a semiconductor substrate. Ion beams induced through the beam transmitter 300 may be introduced into the implantation-processing chamber 400. The implantation-processing chamber 400 may include a support configured to support the at least one object. The support may be configured to a desired angle to the incoming ion beams. For example, the support may be rotated and linearly moved to the desired position relatively to the beam transmitter 300. Thus, the ions may be rapidly implanted into the object by driving the support.

The controller 500 may be configured to control the whole operation of the ion implantation apparatus 10. Any suitable controller may be used.

Figure 2:
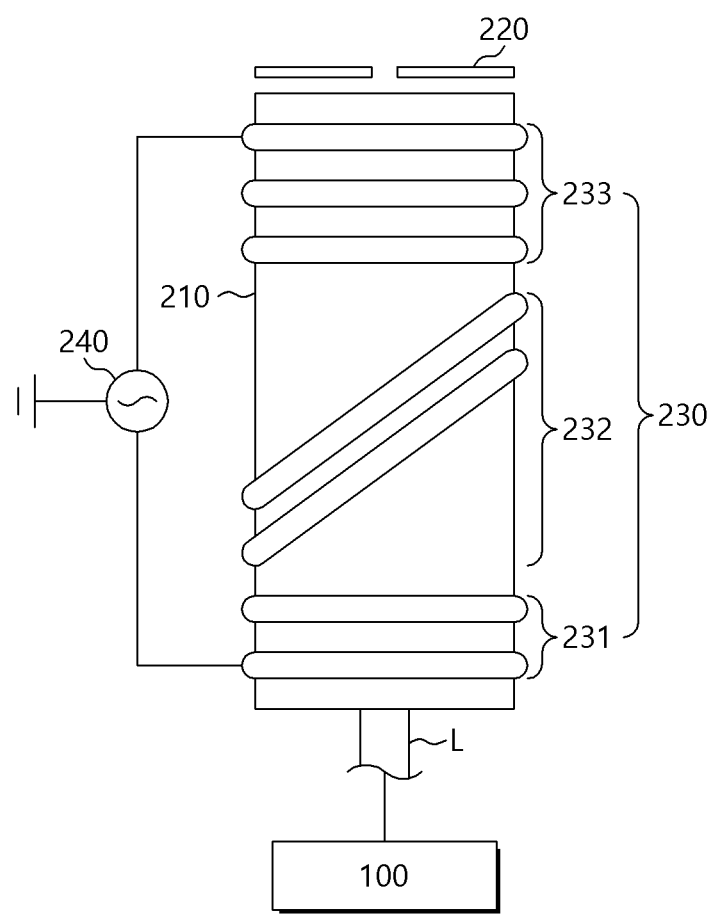
FIG. 2 is a cross-sectional view illustrating an ion source head in accordance with an embodiment of the present disclosure.

FIG. 2 is a cross-sectional view illustrating an ion source head in accordance with an embodiment of the present disclosure.

Referring to FIG. 2, the ion source head 200 may include a reaction chamber 210, a slit 220, a coil 230 and a power source 240.

The ion source head 200 may receive the source gas from the gas supplier 100. The source gas may be supplied to the ion source head 200 through a gas line L connected to the gas supplier 100. The source gas in the ion source head 200 may be ionized to form plasma. The ion source head 200 may receive an RF power through the coil 230. Therefore, an induced magnetic field may be formed in the ion source head 200 to ionize the source gas.

The reaction chamber 210 may have a space in which the source gas may be ionized. The reaction chamber 210 may provide the semiconductor substrate with the plasma. The reaction chamber 210 may have a cylindrical shape such as a pipe. The reaction chamber 210 may be formed of or include a ceramic such as $Al_2O_3$. However, the material of the reaction chamber 210 may not be limited to a specific material.

The gas supplier 100 may be connected with the reaction chamber 210 through the gas line L positioned at one side of the reaction chamber 210. The slit 220 may be positioned at the other side of the reaction chamber 210.

The slit 220 may be detachably installed at the reaction chamber 210. The slit 220 may be configured to select the plasma ions in the reaction chamber 210. The selected plasma ions may then be discharged to the beam splitter 300. The slit 220 may be formed of or include tungsten, however, it may not be limited to a specific material.

The coil 230 may be wound on an outer surface of the reaction chamber 210. The coil 230 may be configured to generate the induced magnetic field for ionizing the source gas in the reaction chamber 210. The coil 230 may for example be made of or include copper, silver, copper coated with silver, etc., for forming the magnetic field.

The coil 230 may be wound on the outer surface of the reaction chamber 210 by a gap of about ¼ inches without disconnection. The winding gap of the coil 230 may be changed in accordance with a height of the reaction chamber, the material of the coil 230, etc.

The coil 230 may include a first coil 231, a second coil 232 and a third coil 233.

The first coil 231 may be wound on a lower region of the reaction chamber 210 adjacent to the gas supplier 100. The lower region of the reaction chamber 210 may be from a bottom surface of the reaction chamber 210 to a height of about 5% to about 10% of a total height of the reaction chamber 210. The first coil 231 may be wound along a circumferential direction of the reaction chamber 210. The lower region of the reaction chamber 210 may be connected to the gas supplier 100. A high pressure may be maintained in the lower region of the reaction chamber 210. The lower region of the reaction chamber 210 may correspond to an ignition region for igniting the plasma.

The second coil 232 may be connected between the first coil 231 and the third coil 233. The second coil 232 may be extended obliquely with respect to a height direction and a diameter direction of the reaction chamber 210. The second coil 232 may be positioned at a central region between the lower region and an upper region in the reaction chamber 210. Particularly, the second coil 232 may have a winding direction of about 30° to about 60° with respect to the bottom surface of the reaction chamber 210. The winding direction of the second coil 232 may be changed in accordance with the height of the reaction chamber 210. The central region at which the second coil 232 may be positioned may have a height of from about 10% to about 70% of the total height of the reaction chamber 210 from the bottom surface.

The third coil 233 may be wound on the upper region of the reaction chamber 210 adjacent to the slit 220. The third coil 233 may be wound along the circumferential direction of the first coil 231 similarly to the first coil 231. The upper region of the reaction chamber 210 may be from a height of about 70% to about 90% of a total height of the reaction chamber 210 to a ceiling of the reaction chamber 210.

The first coil 231 may be wound by 1~2 turns along the circumferential direction of the reaction chamber 210. The second coil 232 may be wound by 2~3 turns along the oblique direction. The third coil 233 may be wound by 3~5 turns along the circumferential direction of the reaction chamber 210. The n umber of turns for each section of the coil 230 may be changed.

The lower region and the upper region in the reaction chamber 210 may be exchanged for each other in accordance with the positions of the gas supplier 100 configured to supply the source gas and the slit 220 configured to discharge the ionized plasma.

The power source 240 may be connected to both ends of the coil 230 to apply the RF power to the coil 230. The RF power from the power source 240 may be applied to the coil 230 to induce the magnetic field, thereby generating the plasma.

The ICP apparatus may generate the ICP (hereinafter, referred to as an H-mode) and a capacitively coupled plasma (hereinafter, referred to as an E-mode) in accordance with the RF power applied to the coil 230.

An electron acceleration may be generated by an electric field formed by a difference between a high frequency potential applied to the coil 230 and a plasma potential to generate the E-mode plasma.

A magnetic field may be generated in the reaction chamber 210 by current changes through the coil 230. Electrons may be accelerated by an electric field induced by the magnetic field to generate the H-mode plasma. The ICP apparatus may generate the E-mode plasma. The E-mode plasma may be converted into the H-mode plasma to form the plasma having a high density.

The E-mode plasma may be dependent upon the high frequency potential of the coil 230, i.e., an electromagnetic force generated by the coil 230. For example, when the coil 230 is spirally wound, the electromagnetic force may be generated along the height direction or a lengthwise direction of the reaction chamber 210. Thus, the electrons may be accelerated along the height direction of the reaction chamber 210. However, because the reaction chamber 210 may have a height greater than the diameter, the accelerated ions may have a long movement distance to generate ion loss as contaminants. Therefore, in order to generate the high density of the plasma, it may be required to reduce the generation of the E-mode plasma.

In order to decrease the generation of the E-mode plasma, the coil 230 may include the first coil 231, the second coil 232 and the third coil 233. The second coil 232 may have the oblique shape with respect to the first coil 231 and the third coil 233. The oblique coil 232 may be connected between the first and third coils 231 and 233 having the spiral shape. Thus, because the coil 230 may be obliquely wound on the central region of the reaction chamber 210, the electromagnetic force may be generated in the central region of the reaction chamber along another oblique direction with respect to the oblique direction of the coil 230. Particularly, an electromagnetic force line along the oblique direction may be shorter than the height of the reaction chamber 210 to reduce the movement distance of the accelerated ions, thereby improving particle collision probability.

As a result, the plasma density may be increased so that the E-mode plasma may be readily converted into the H-mode plasma. Therefore, a ratio of the E-mode plasma may be reduced and the operation of the H-mode plasma may be induced to increase the plasma generation efficiency.

Figure 3:
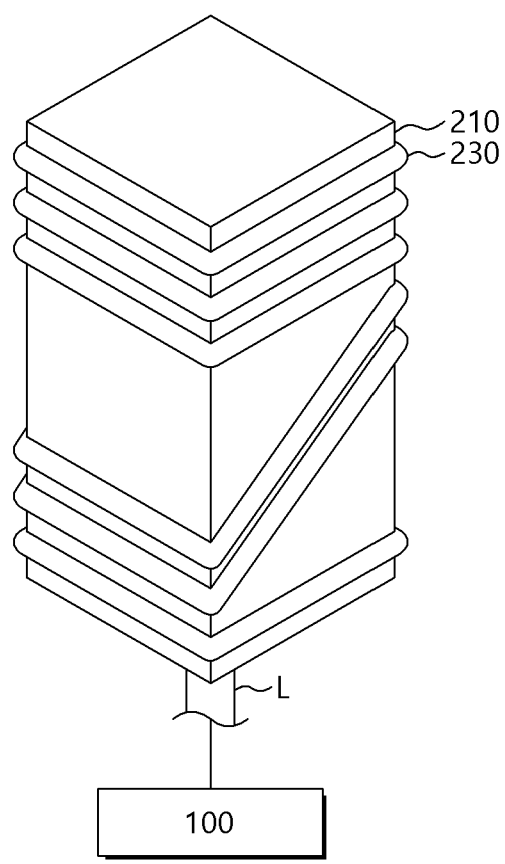
FIG. 3 is a perspective view illustrating an ion source head in accordance with an embodiment of the present disclosure.

FIG. 3 is a perspective view illustrating an ion source head in accordance with an embodiment of the present disclosure.

The ion source head 200 in FIG. 2 may include the cylindrical reaction chamber 210. Alternatively, as shown in FIG. 3, the reaction chamber 210 may have an angular shape, for example, a square post shape.

When the coil 230 is wound on the reaction chamber 210 having the angular portion, the coil 230 at corners of the reaction chamber 210 may be adjacent to each other to induce the magnetic field having a high density, thereby increasing the plasma generation efficiency.

According to various embodiments, the coil may be wound on the outer surface of the reaction chamber along the oblique direction with respect to a diameter or the height of the reaction chamber. Thus, the electromagnetic force may be generated in the reaction chamber along the direction substantially perpendicular to the oblique coil to decrease an ion acceleration length and improve plasma generation efficiency in a low amount. As a result, ion byproducts may also be decreased by decreasing the ion acceleration length.

The above described embodiments of the present invention are intended to illustrate and not to limit the present invention. Various alternatives and equivalents are possible. The invention is not limited by the embodiments described herein. Nor is the invention limited to any specific type of semiconductor device. Additions, subtractions, or modifications which are apparent in view of the present disclosure are intended to fall within the scope of the appended claims.

What is claimed is:

1. An ion source head comprising:
   a reaction chamber having an ionization space, the reaction chamber divided into a lower region, a central region and an upper region; and
   a coil configured to be wound on an outer surface of the reaction chamber,
   wherein the coil comprises:
      a first coil spirally wound on an outer surface of the lower region of the reaction chamber;
      a second coil wound on the central region of the reaction chamber; and
      a third coil spirally wound on an outer surface of the upper region of the reaction chamber,
      wherein the second coil is connected between the first coil and the third coil, and the second coil has a winding direction oblique to a winding direction of the first and third coils.

2. The ion source head of claim 1, wherein the oblique winding direction of the second coil is about 30° to about 60° with respect to the winding direction of the first and third coils.

3. The ion source head of claim 1, further comprising a power source configured to supply a power to both ends of the coil.

4. The ion source head of claim 1, wherein the reaction chamber has a cylindrical shape or an angular post shape.

5. An ion implantation apparatus comprising:
   the ion source head of claim 1;
   a beam transmitter configured to transmit plasma ions generated in the ion source head; and
   an implantation-processing chamber configured to implant the plasma ions provided through the beam transmitter into an object,
   wherein the winding direction of the first and third coils is the same and perpendicular to a height direction of the reaction chamber of the ion source head.

6. The ion implantation apparatus of claim 5, wherein the oblique winding direction of the second coil is about 30° to about 60° with respect to the winding direction of the first and third coils.

7. The ion implantation apparatus of claim 5, further comprising a power source configured to supply a power to both ends of the coil.

8. The ion implantation apparatus of claim 5, wherein the reaction chamber has a cylindrical shape or an angular post shape.

9. An ion implantation apparatus comprising:
   an ion source head including a coil, the coil configured to generate an electromagnetic force along a height direction of a reaction chamber and an oblique direction with respect to the height direction;
   a beam transmitter configured to transmit plasma ions generated in the ion source head; and
   an implantation-processing chamber configured to implant the plasma ions provided through the beam transmitter into an object.

10. The ion implantation apparatus of claim 9, wherein the ion source head comprises:
   the reaction chamber having an ionization space, the reaction chamber divided into a lower region, a central region and an upper region; and
   a coil configured to wind on an outer surface of the reaction chamber,
   wherein the coil comprises:
      a first coil configured to wind the lower region of the reaction chamber;

a second coil configured to wind the central region of the reaction chamber; and a third coil configured to wind the upper region of the reaction chamber, wherein the first coil and the third coil are spirally wound on the outer surface of the reaction chamber, the second coil is connected between the first coil and the third coil, and the second coil has a winding direction oblique to a winding direction of the first and third coils.

11. The ion implantation apparatus of claim 10, wherein the oblique winding direction of the second coil is about 30° to about 60° with respect to the winding direction of the first and third coils.

12. The ion implantation apparatus of claim 10, further comprising a gas supplier connected to the lower region of the reaction chamber to supply a source gas to the reaction chamber.

13. The ion implantation apparatus of claim 10, further comprising a slit arranged between the upper region of the reaction chamber and the beam splitter to select the plasma ions.

14. The ion implantation apparatus of claim 9, further comprising a power source configured to supply a power to both ends of the coil.

15. The ion implantation apparatus of claim 9, wherein the reaction chamber has a cylindrical shape or an angular post shape.

* * * * *